United States Patent
Passamani (10) Patent No.: US 10,797,719 B2
(45) Date of Patent: Oct. 6, 2020

(54) MAPPING CIRCUIT AND METHOD FOR SELECTING CELLS OF A MULTI CORE HYBRID I/Q DIGITAL TO ANALOG CONVERTER

(71) Applicant: Intel IP Corporation, Santa Clara, CA (US)

(72) Inventor: Antonio Passamani, Villach (AT)

(73) Assignee: Intel IP Corporation, Santa Clara, CA (US)

( * ) Notice: Subject to any disclaimer, the term of this patent is extended or adjusted under 35 U.S.C. 154(b) by 0 days.

(21) Appl. No.: 16/474,582

(22) PCT Filed: Mar. 31, 2017

(86) PCT No.: PCT/US2017/025239
§ 371 (c)(1),
(2) Date: Jun. 28, 2019

(87) PCT Pub. No.: WO2018/182660
PCT Pub. Date: Oct. 4, 2018

(65) Prior Publication Data
US 2020/0014397 A1 Jan. 9, 2020

(51) Int. Cl.
| | | |
|---|---|---|
| H03M 1/66 | (2006.01) | |
| H04B 1/02 | (2006.01) | |
| H04B 1/00 | (2006.01) | |
| H04B 1/04 | (2006.01) | |

(52) U.S. Cl.
CPC .......... H03M 1/662 (2013.01); H04B 1/0028 (2013.01); H04B 1/04 (2013.01)

(58) Field of Classification Search
CPC ........ H03M 1/66; H03M 1/661; H03M 1/662; H03M 1/68; H04B 1/0028
See application file for complete search history.

(56) References Cited

U.S. PATENT DOCUMENTS

| | | | |
|---|---|---|---|
| 7,768,435 B2 * | 8/2010 | Montvelishsky | ....... H03M 1/68 341/144 |
| 7,884,747 B2 * | 2/2011 | McLachlan | ......... H03M 1/0845 341/144 |

(Continued)

OTHER PUBLICATIONS

"A Class-G Switched-Capacitor RF Power Amplifier", Sang-Min Yoo, Member, IEEE, Jeffrey S. Walling, Senior Member, IEEE, Ofir Degani, Member, IEEE, Benjamin Jann, Member, IEEE, Ram Sadhwani, Jacques C. Rudell, Senior Member, IEEE, and David J. Allstot, Life Fellow, IEEE Journal of Solid-State Circuits, vol. 48, No. 5, May 2013.

(Continued)

*Primary Examiner* — Quochien B Vuong
(74) *Attorney, Agent, or Firm* — 2SPL Patent Attorneys PartG mbB (57) ABSTRACT

A mapping circuit (300) for selecting cells of a multi core hybrid I/Q digital to analog converter includes a first sub-mapping circuit (310a) configured to define a first group of cores for each data symbol to be transmitted and to select cells of the first group of cores for an I-code of the data symbol to be transmitted. The mapping circuit (310b) further includes a second sub-mapping circuit configured to define a second group of cores for each data symbol and to select cells of the second group of cores for a Q-code of the data symbol.

14 Claims, 8 Drawing Sheets

(56) References Cited

U.S. PATENT DOCUMENTS

| | | | |
|---|---|---|---|
| 8,581,760 B2* | 11/2013 | Muhammad | H03M 1/201 |
| | | | 323/213 |
| 9,647,678 B2* | 5/2017 | Passamani | H03M 1/66 |
| 10,056,924 B2* | 8/2018 | Schafferer | H03F 1/3241 |
| 2011/0299207 A1 | 12/2011 | McMahill et al. | |
| 2013/0207823 A1 | 8/2013 | Wyville | |
| 2015/0171878 A1 | 6/2015 | Schafferer et al. | |
| 2016/0182076 A1 | 6/2016 | El-Chammas | |
| 2017/0093422 A1 | 3/2017 | Passamani et al. | |

OTHER PUBLICATIONS

"A 1.1V, 28.6dBm Fully Integrated Digital Power Amplifier for Mobile and Wireless Applications in 28nM CMOS Technology with 35% PAE", Antonio Passamani et al, 2017, IEEE, International Solid-State Circuits Conference.

* cited by examiner

MAPPING CIRCUIT AND METHOD FOR SELECTING CELLS OF A MULTI CORE HYBRID I/Q DIGITAL TO ANALOG CONVERTER

FIELD

Examples relate to a mapping circuit and method for selecting cells of a multi core hybrid I/Q digital to analog converter.

BACKGROUND

Multi core hybrid I/Q digital to analog converters for applications in mobile telecommunication applications comprise at least two distinct cores, each core comprising multiple individually selectable cells contributing to the generation of an analog output signal. Each cell can selectively contribute to the generation of an I-component or of a Q-component of the analog output signal. The selection is performed based on an I-code and based on a Q-code, each being a digital quantity to be separately converted in a corresponding output signal. For each I-code and Q-code, a mapping algorithm can individually compute a corresponding number of cells of all cores to be used to generate the corresponding analog output signal. The operation of the multiple cores of a hybrid I/Q digital to analog converter itself does, however, consume energy, that depends, amongst others, on the distribution of the selected cells within the cores. There is a demand to select the cells of the multiple cores such that a multi core hybrid I/Q digital to analog converter works at high efficiency.

BRIEF DESCRIPTION OF THE FIGURES

Some examples of apparatuses and/or methods will be described in the following by way of example only, and with reference to the accompanying figures, in which.

DETAILED DESCRIPTION

Various examples will now be described more fully with reference to the accompanying drawings in which some examples are illustrated. In the figures, the thicknesses of lines, layers and/or regions may be exaggerated for clarity.

Accordingly, while further examples are capable of various modifications and alternative forms, some particular examples thereof are shown in the figures and will subsequently be described in detail. However, this detailed description does not limit further examples to the particular forms described. Further examples may cover all modifications, equivalents, and alternatives falling within the scope of the disclosure. Like numbers refer to like or similar elements throughout the description of the figures, which may be implemented identically or in modified form when compared to one another while providing for the same or a similar functionality.

It will be understood that when an element is referred to as being "connected" or "coupled" to another element, the elements may be directly connected or coupled or via one or more intervening elements. If two elements A and B are combined using an "or", this is to be understood to disclose all possible combinations, i.e. only A, only B as well as A and B. An alternative wording for the same combinations is "at least one of A and B". The same applies for combinations of more than 2 Elements.

The terminology used herein for the purpose of describing particular examples is not intended to be limiting for further examples. Whenever a singular form such as "a," "an" and "the" is used and using only a single element is neither explicitly or implicitly defined as being mandatory, further examples may also use plural elements to implement the same functionality. Likewise, when a functionality is subsequently described as being implemented using multiple elements, further examples may implement the same functionality using a single element or processing entity. It will be further understood that the terms "comprises," "comprising," "includes" and/or "including," when used, specify the presence of the stated features, integers, steps, operations, processes, acts, elements and/or components, but do not preclude the presence or addition of one or more other features, integers, steps, operations, processes, acts, elements, components and/or any group thereof.

Unless otherwise defined, all terms (including technical and scientific terms) are used herein in their ordinary meaning of the art to which the examples belong.

Figure 1:
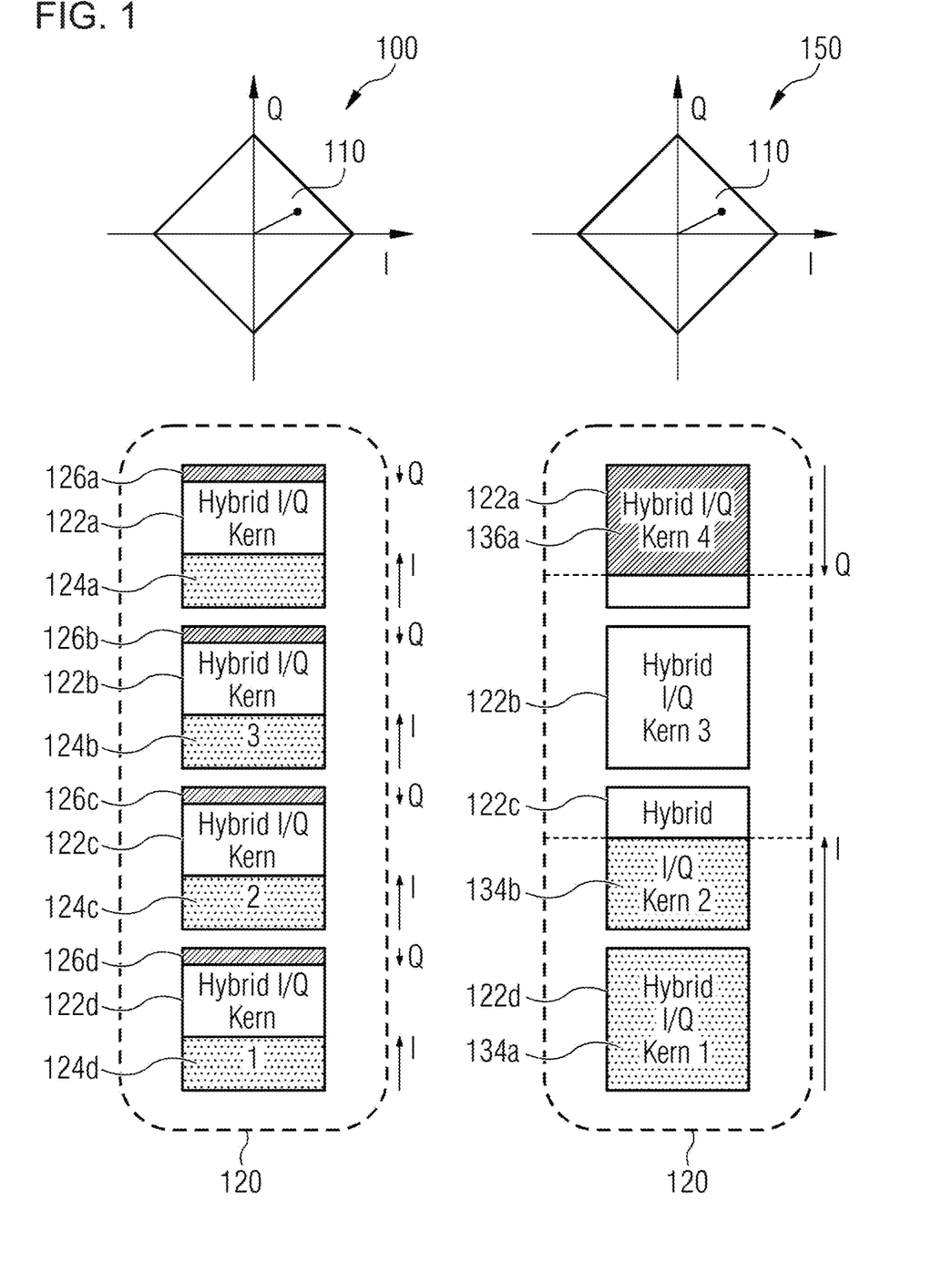
FIG. 1 illustrates an example of a method for selecting cells of a multi core hybrid I/Q digital to analog converter in comparison to a conventional approach.
Figure 2:
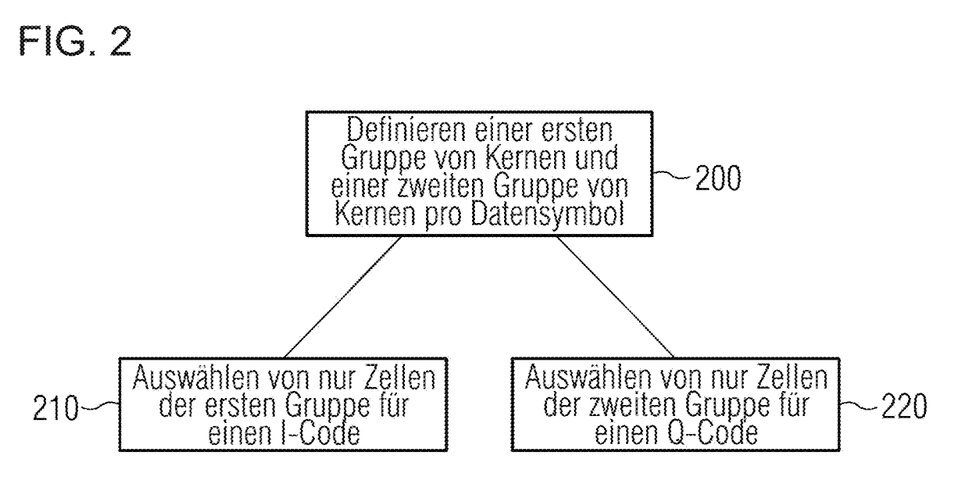
FIG. 2 illustrates a flowchart of an example of a method for selecting cells of a multi core hybrid I/Q digital to analog converter.

FIGS. 1 and 2 illustrate an example of a method for selecting cells of a multi core hybrid I/Q digital to analog converter 120 in comparison to a conventional approach. The left graph of FIG. 1 illustrates a conventional approach to select cells of a hybrid I/Q digital to analog converter 120 having four cores 122a, 122b, 122c and 122d to enable a better understanding of the environment the subsequently described examples operate in. The right graph and FIG. 2 illustrate an example of a method for selecting cells of a multi core hybrid I/Q digital to analog converter 120 as described herein. Each core of the digital to analog converter 120 has a number of cells arranged in an array and an I-code input is to be given to a first number of cells to be used to convert an I-code of an I/Q data symbol to an analog signal. Likewise, a Q-code input is to be given a second number of cells to be used to convert a Q-code to an analog signal. An I-code is a digital number representing the in-phase coordinate of a data symbol within the complex plane and, likewise, a Q-code represents the quadrature coordinate. While the I-code and the Q-code may be given as digital numbers corresponding to an arbitrary point on a trajectory in the I/Q plane, the first and second numbers may be numbers that indicate a number of cells of an array to be used to generate the analog signal corresponding to the I-code and the Q-code, respectively. As illustrated in FIG. 1, identical data symbols or points 110 within the I/Q plain result in an identical number of cells to be used for both components, irrespective of the selection of the cells within the four cores 122a-122d.

In a conventional approach, the computed number of cells is selected symmetrically for each core so that each core activates a nearly identical number of cells for the I-code and the Q-code, respectively. As illustrated in FIG. 1, nearly identical I-portions 124a-124d and Q-portions 126a-126d are used in all cores to generate the respective analog signals.

The example illustrated in graph 150, however, defines a first group of cores and a second group of cores for each data symbol to be transmitted and subsequently selects only cells of the first group of cores for an I-code of a data symbol to be transmitted. Further, only cells of the second group of cores are selected for the Q-code of the data symbol so that mostly none of the cores are simultaneously used to convert the I-code and the Q-code. This may increase the efficiency of the multi core hybrid I/Q digital to analog converter significantly for some combinations of I-codes and Q-codes to be converted. In particular, efficiency of a core in which cells are almost completely used may exceed the efficiency of the same core in which only a small fraction of its available cells are used. Further, efficiency of a core having selected number of cells used to convert only an I-code (or a Q-code) may exceed the efficiency of the same core having the same number of cells selected to simultaneously convert an I-Code using a fraction of the selected cells and a Q-code using the remaining of the selected cells.

According to some examples, selecting the cells for an I-code of a data symbol to be transmitted starts only with cells of the first group of cores (e.g. at core 122d in FIG. 1) while selecting the cells for a Q-code starts only with cells of the second (which may be different than the first group of cores) group of cores (e.g. at core 122a in FIG. 1). In other words, the cells are filled such that it is avoided that cells of an identical core are simultaneously used to convert an I-Code and a Q-code, although a core principally has the capability to do so. In some examples, for each of the I-code and the Q-code, all cells of a single core are selected before further cells of another core are selected, if the code to be converted so necessitates because it has a higher energy than the one that can be generated by a single core. In the example of FIG. 1, this results in all cells 134a of core 122d and a major fraction of the cells 134b of core 122c to be used to convert the I-code while a major fraction of cells 136a of core 122a are used to convert the Q-code. While the sum of cells 124a to 124d equals the sum of cells 134a and 134b and the sum of cells 126a to 126d equals the number of cells 136a so that an equal I/Q code is converted, the generation of the analog signal according to the example in the right illustration 150 consumes less energy, i.e. the multi core hybrid I/Q digital to analog converter 120 is operated with higher efficiency when the cells are selected according to the example of FIG. 1, right graph.

As again illustrated in the flowchart of FIG. 2, an example of a method for selecting cells of a multi core hybrid I/Q digital to analog converter comprises defining (200) a first group of cores and a second group of cores for each data symbol to be transmitted. Further, the method comprises selecting (210) only cells of the first group of cores for an I-code of the data symbol to be transmitted and selecting (220) only cells of the second group of cores for a Q-code of the data symbol. Optionally, the method may comprise computing a first number of cells for the I-code and a second number of cells for the Q-code. As will be further discussed for the examples of mapping circuits for selecting cells of a multi core hybrid I/Q digital to analog converter illustrated in FIGS. 3 to 6, the mapping algorithms to compute the first number of cells for the I-code and the second number of cells for the Q-code can be identical, saving on both, design and implementation cost as long as the cells are filled as previously described.

According to the example illustrated in FIG. 1, the first number of cells of N cores (N being four in the example of FIG. 1) are selected by filling the cells of the cores of the first group (cores 122d and 122c) in an ascending order starting from the first core 124d and the second number of cells are selected by filling the cells of the cores of the second group (core 122a) in a descending order starting from the N-th core.

For four cores having a total number of 32768 cells per core, the filling in different directions may be achieved by performing a mapping algorithm according to the following pseudo code to compute and select the number of cells for both the I-code and the Q-code. In the following, norm_o[X] denotes the fraction of all cells of core number X to be used to convert the input code v_i to an analog output. For each core # X, the operation min(max((norm_i−Y)*4,0),1), with Y being (X−1)*0,25, assures that the individual cores are completely used in case the result is unity, or to the required fraction in case the result is between zero and unity.

```
// VerilogA for backoffehnancer, veriloga
`include "constants.vams"
`include "disciplines.vams"
module backoffehnancer(v_o_0, v_o_1, v_o_2, v_o_3, v_i);
output v_o_0, v_o_1, v_o_2, v_o_3;
electrical v_o_0, v_o_1, v_o_2, v_o_3;
input v_i;
electrical v_i;
`define MAX_S 32768
real norm_i;
real norm_o[3:0];
analog begin
norm_i = V(v_i)/`MAX_S;
norm_o[0] = min(max((norm_i−0.00)*4,0),1);
norm_o[1] = min(max((norm_i−0.25)*4,0),1);
norm_o[2] = min(max((norm_i−0.50)*4,0),1);
norm_o[3] = min(max((norm_i−0.75)*4,0),1);
V(v_o_0) <+ norm_o[0]*`MAX_S;
V(v_o_1) <+ norm_o[1]*`MAX_S;
V(v_o_2) <+ norm_o[2]*`MAX_S;
V(v_o_3) <+ norm_o[3]*`MAX_S;
end
endmodule
```

If, for example, a digital to analog converter (DAC) to be used together with the mapping algorithm does only accept codes ranging from 0 to 2^bits−1, the following algorithm may be used. The difference to the previously illustrated version is the saturation code norm_o[X] of each core, which is diminished by one LSB, and, consequently, the residual value accumulated from saturated DACs, is reduced as well:

```
// VerilogA for backoffehnancer, veriloga
`include "constants.vams"
`include "disciplines.vams"
module backoffehnancer(v_o_0, v_o_1, v_o_2, v_o_3, v_i);
output v_o_0, v_o_1, v_o_2, v_o_3;
electrical v_o_0, v_o_1, v_o_2, v_o_3;
input v_i;
electrical v_i;
`define MAX_S 32768
`define LSB 1/32768
real norm_i;
```

-continued

```
  real norm_o[3:0];
  analog begin
    norm_i = V(v_i)/`MAX_S;
    norm_o[0] = min(max((norm_i-0.00-0*LSB)*4,0),1-LSB);
    norm_o[1] = min(max((norm_i-0.25-1*LSB)*4,0),1-LSB);
    norm_o[2] = min(max((norm_i-0.50-2*LSB)*4,0),1-LSB);
    norm_o[3] = min(max((norm_i-0.75-3*LSB)*4,0),1-LSB);
    V(v_o_0) <+ norm_o[0]*`MAX_S;
    V(v_o_1) <+ norm_o[1]*`MAX_S;
    V(v_o_2) <+ norm_o[2]*`MAX_S;
    V(v_o_3) <+ norm_o[3]*`MAX_S;
  end
endmodule
```

As shown in FIG. 1, conventionally, I/Q codes to be transmitted are assigned symmetrically from the output of a baseband signal generator to the input of each of the four cores of the transmitter. The example illustrated in the right graph 150 of FIG. 1 assigns the input code to be transmitted in an asymmetric fashion instead. This is achieved by means of a mapper (mapping circuit) cascaded between output of the baseband signal generator and the input of the transmitter cores. Assuming the cores are numbered in arbitrary ascending order, as many cores as possible are turned on from the first to the last core with Q codes, and, as many cores as possible are turned on from the last to the first core with I codes. Granted that symmetric and asymmetric transmitter configuration both represent the same overall transmitted point, as shown in the vector diagram displayed on top of FIG. 1, asymmetric operation grants higher efficiency, even though the same output code is transmitted.

Figure 3:
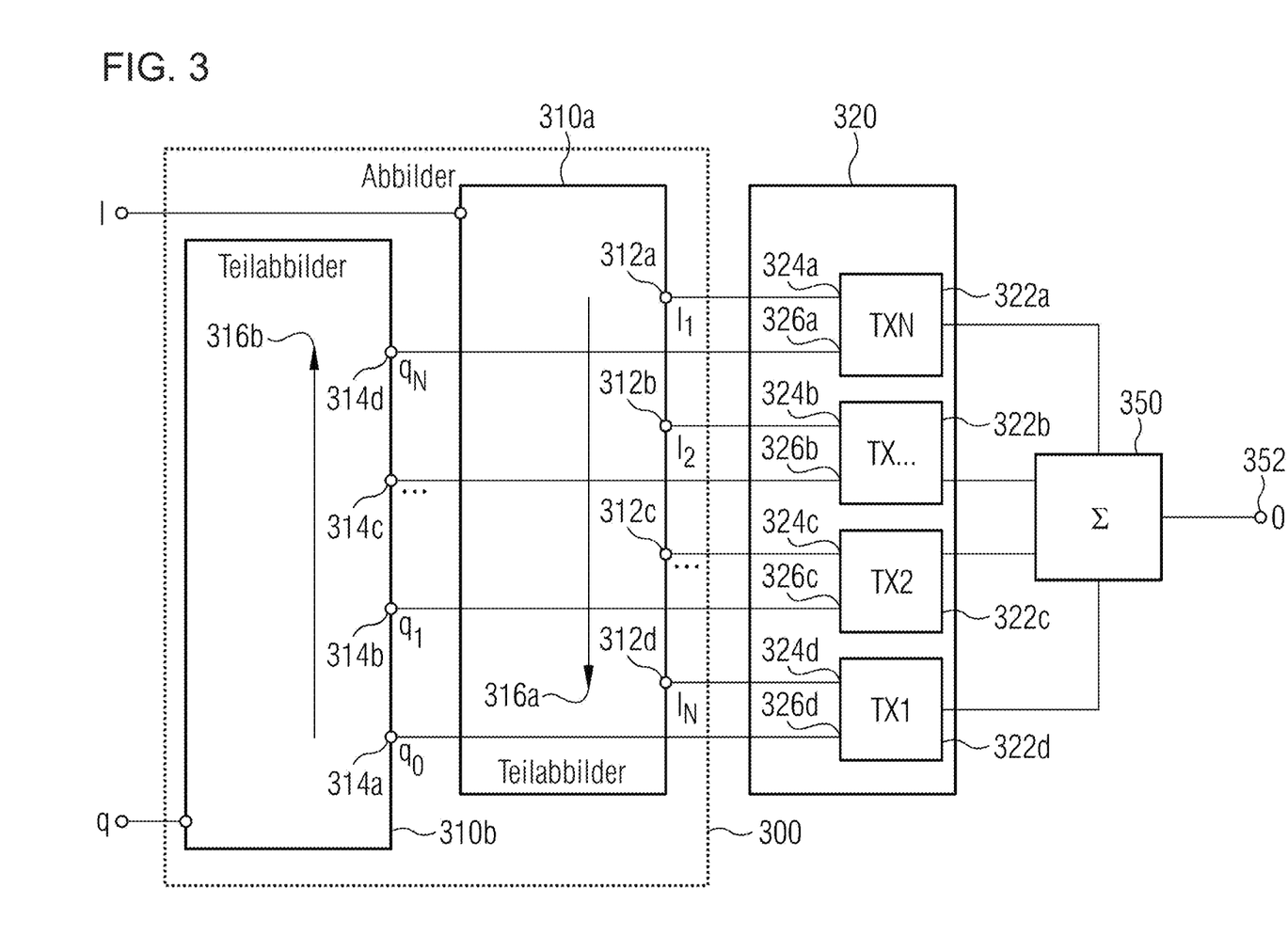
FIG. 3 illustrates an example of a mapping circuit for selecting cells of a multi core hybrid I/Q digital to analog converter.

FIG. 3 illustrates an example of a mapping circuit 300 for selecting cells of a multi core hybrid I/Q digital to analog converter 320 having 4 cores 322a, . . . , 322d. Each of the cores comprises an I-code input 324a, . . . , 324d as well as a Q-code input 326a, . . . , 326d. The mapping circuit comprises a first sub-mapping circuit 310a configured to start selecting cells of only a first group of cores for an I-code of a data symbol to be transmitted and a second sub-mapping circuit 310b configured to start selecting cells of only a second group of cores for a Q-code of the data symbol. In order to be able to select the cells, each sub-mapper comprises 4 outputs 312a, . . . , 312d and 314a, . . . , 314d, coupled to the I-code inputs 324a, . . . , 324d and to the Q-code inputs 326a, . . . , 326d, respectively. While the sub-mappers use identical logic to compute a first number of cells to select for an I-code and to compute a second number of cells to select for a Q-code, the order in which the outputs 312a, . . . , 312d and 314a, . . . , 314d are connected to the cores is reversed to achieve filling/selecting the cells in opposite directions and starting from opposing sides, as illustrated in FIG. 1. The opposite coupling order is also illustrated by means of arrows 316a and 316b pointing in opposite directions.

The reversed coupling achieves that the first sub-mapping circuit 310a start selecting cells only within core 322a while the second sub-mapping circuit starts selecting cells only within core 322d. For a more general concept with N cores, this would result in a mapping circuit having N outputs of the first sub-mapping circuit for selecting the number of cells of an N-core hybrid I/O digital to analog converter coupled to I-code inputs of the N-cores in an ascending order and N outputs of the second sub-mapping circuit coupled to Q-code inputs of the N-cores in a descending order.

As further illustrated in FIG. 3, the multi core hybrid I/Q digital to analog converter illustrated in FIG. 3 further comprises a signal combination circuit 350 configured to combine I-code and Q-code outputs of each of the cores 322a, . . . , 322d to generate an analog radio frequency signal at an output 352 of the signal combiner.

FIG. 4 again illustrates the example of the mapping circuit 300 implementing the functionality described with respect to FIG. 3 in more detail. Like elements are given like reference numbers. In particular, the sub-mappers are shown to include the hardware blocks required to implement the first mapping algorithm indicated above, which shall only be shortly summarized. In particular, to perform the functionality of min(max((norm_i-Y)*4,0),1), each of 4 stages 352a, . . . , 352d within a sub-mapper comprises a multiplier 354a, . . . , 354d to multiply the input quantity by 4 and a threshold circuit 356a, . . . , 356d to only forward results of the multiplication which are greater than zero, at the same time limiting the result to a maximum of 1 to select the appropriate number of cells of the associated core. In between the stages, the sub mappers comprise subtractors 358a, 358b and 358c to reduce the number forwarded from each stage to the following by ¼ to implement the term (norm_i-Y) of the above equation (Y being (X-1)*¼). In the lower graph of FIG. 4, the signal combiner is illustrated again with it's I- and Q-inputs for each respective output of the individual cores 322a, . . . , 322d. The Signal combiner 350 is coupled to an antenna 360, eventually with an intermediate power amplifier coupled to the output of signal combiner 350 so as to amplify the radio frequency signal before it is transmitted by means of the antenna 360.

Figure 4:
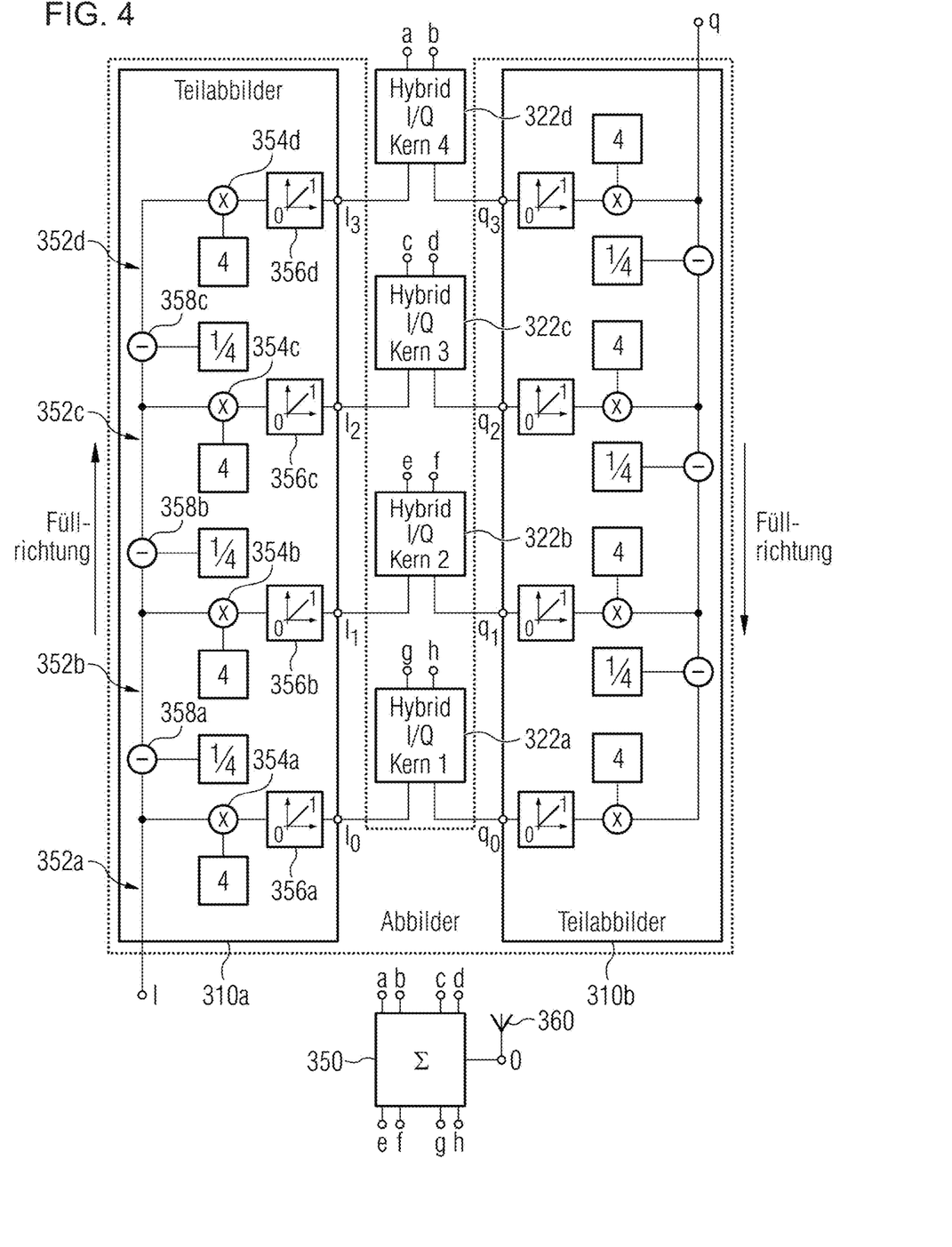
FIG. 4 illustrates a more detailed illustration of the example of FIG. 3.
Figure 5:
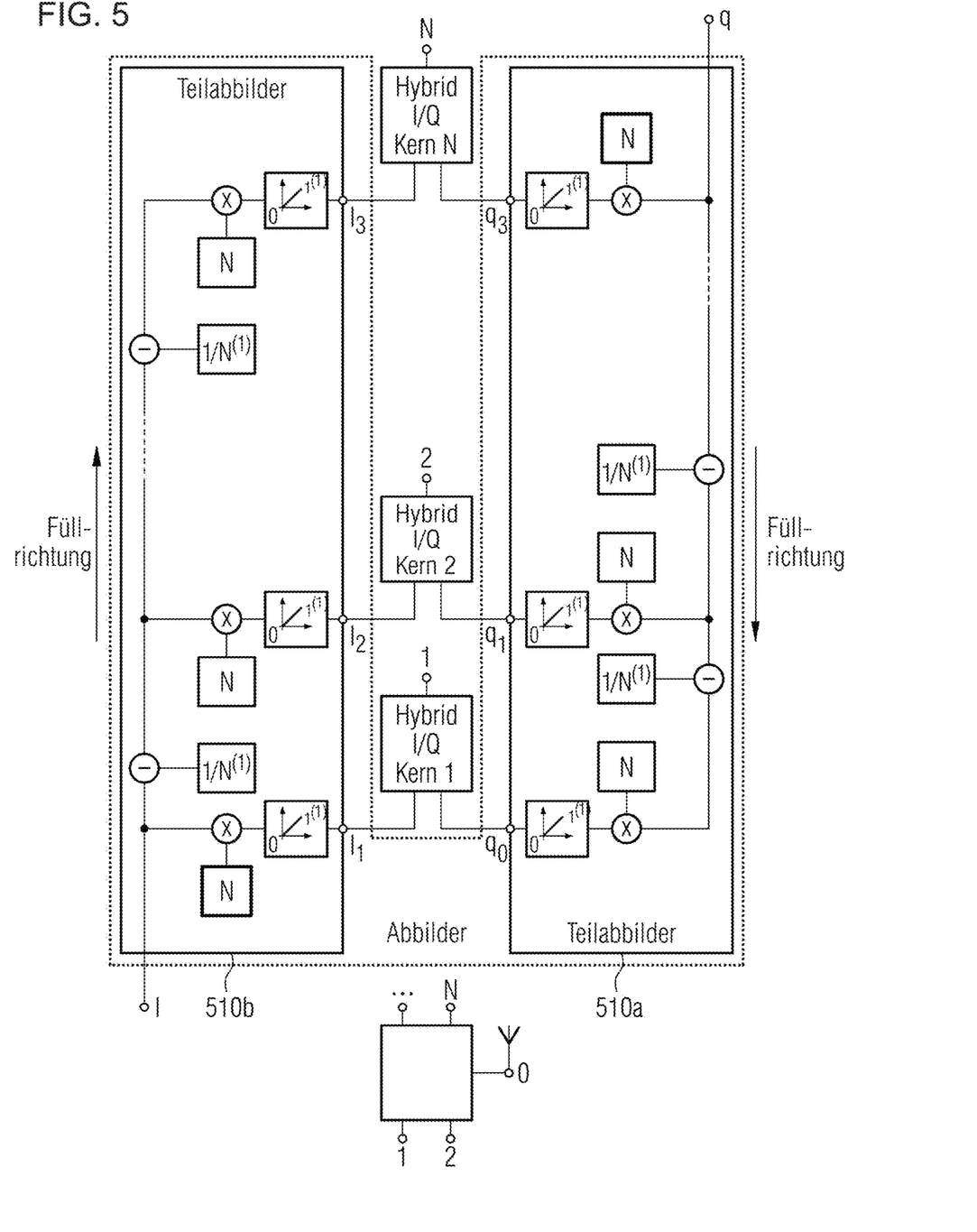
FIG. 5 illustrates a generalization of the example of FIG. 4.

FIG. 5 illustrates the mapping circuit of FIG. 4, generalized to serve N cores. The generalization essentially increases the number of the stages of the sub-mappers. Therefore, a mostly redundant detailed description of the example of FIG. 5 is not given. Optionally, the subtracted term 1/N might become 1/N-1LSB, and the saturation term 1 might become 1-1LSB for DACs which are only accepting codes in the interval (0:1-1LSB). Other back-off strategies are as well possible using the same mapper-sub-mapper concept, for example, in a four-cores system, transmitters might be grouped in groups, for example of two, and then the asymmetric mapping might be implemented between the two groups, each core of the group sharing the group input.

Figure 6:
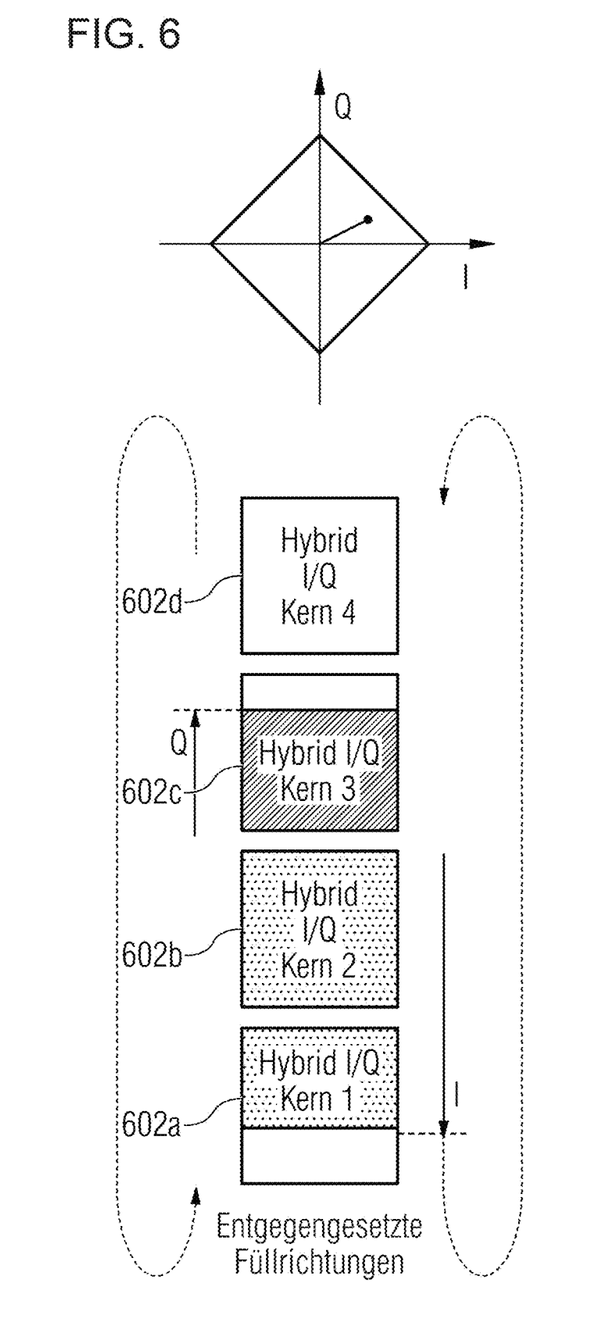
FIG. 6 illustrates a further example for a method for selecting cells of a multi core hybrid I/Q digital to analog converter.

FIG. 6 illustrates a further example for a method for selecting cells of a multi core hybrid I/Q digital to analog converter having 4 cores, which are identified by core numbers 1 to 4, starting from core 602a and ending at core 602d. According to the example of FIG. 6 the cores are also filled such that only cells of a first group of cores are initially selected for an I-code of a data symbol to be transmitted and that only cells of a second group of cores are initially selected for a Q-code of the data symbol. However, the filling direction is changed assuming the layout of the cores 602a, . . . , 602d given in FIG. 6. Further, it is to be noted that the same I/Q symbol than in FIG. 1 is converted according to the example in FIG. 6. While FIG. 6 illustrates 4 cores, the selection of the cells illustrated in FIG. 6 can be characterized in generalizing to N cores as selecting the second number of cells of the N cores by filling the cells of the cores of the second group in an ascending order starting from core (N/2)+1 (core #3 in FIG. 6) and selecting the first number of cells filling the cells of the cores of the first group in a descending order starting from core N/2 (core #2 in FIG. 6).

In the example of FIG. 6, opposite filling-directions are implemented in a ring-fashion, in which the code corresponding to the selected cells builds up from the center of the combined structure towards the outwards. In case large structures are used, this technique enables, for low codes selecting a comparatively small number of cells, a better matching between the used cells of the DACs. In fact, as shown in FIG. 6, smaller codes fill-up adjacent cells, for which gradient effects are reduced as with respect to further away cells. Larger codes, however, wrap around the lowest-DAC up to the highest-DAC, for I, or the opposite for Q (i.e. the used cores roll over from core N to core 1 and from core 1 to core N).

The implementation of the mapping circuit used for the example of FIG. 6 may be the same as presented in FIGS. 3 to 5. In fact, it can be shown that by rearranging mapping of the outputs of the sub-mappers to the individual cores, the mapping as illustrated in FIG. 6 or in FIG. 1 can be achieved with the implementation of mapping circuits shown in FIGS. 3 to 5. For the example of FIG. 6, the outputs of the first stage 352a of sub-mapper 310a would be coupled to the third core 602c, the second stage would be coupled to the fourth core 602d, the third stage would be coupled to the first core 602a and the fourth stage 352d would be coupled to the second core 602b (MAPPER(TX4out) to TX2(in), MAPPER(TX1out) to TX3(in), MAPPER(TX2out) to TX4(in) and MAPPER(TX3out) to TX1(in)).

When the sub-mappers introduced in FIGS. 3 and 4 are used to implement the example of FIG. 6, the generalized concept can be defined such that N outputs of the second sub-mapping circuit for selecting the number of cells of an N-core hybrid I/O digital to analog converter are coupled to Q-code inputs of the N-cores in an ascending order starting from core (N/2)+1 and rolling over to the first core. Likewise, the N outputs of the first sub-mapping circuit are coupled to Q-code inputs of the N-cores in a descending order starting from core N/2 and rolling over to N.

Figure 7:
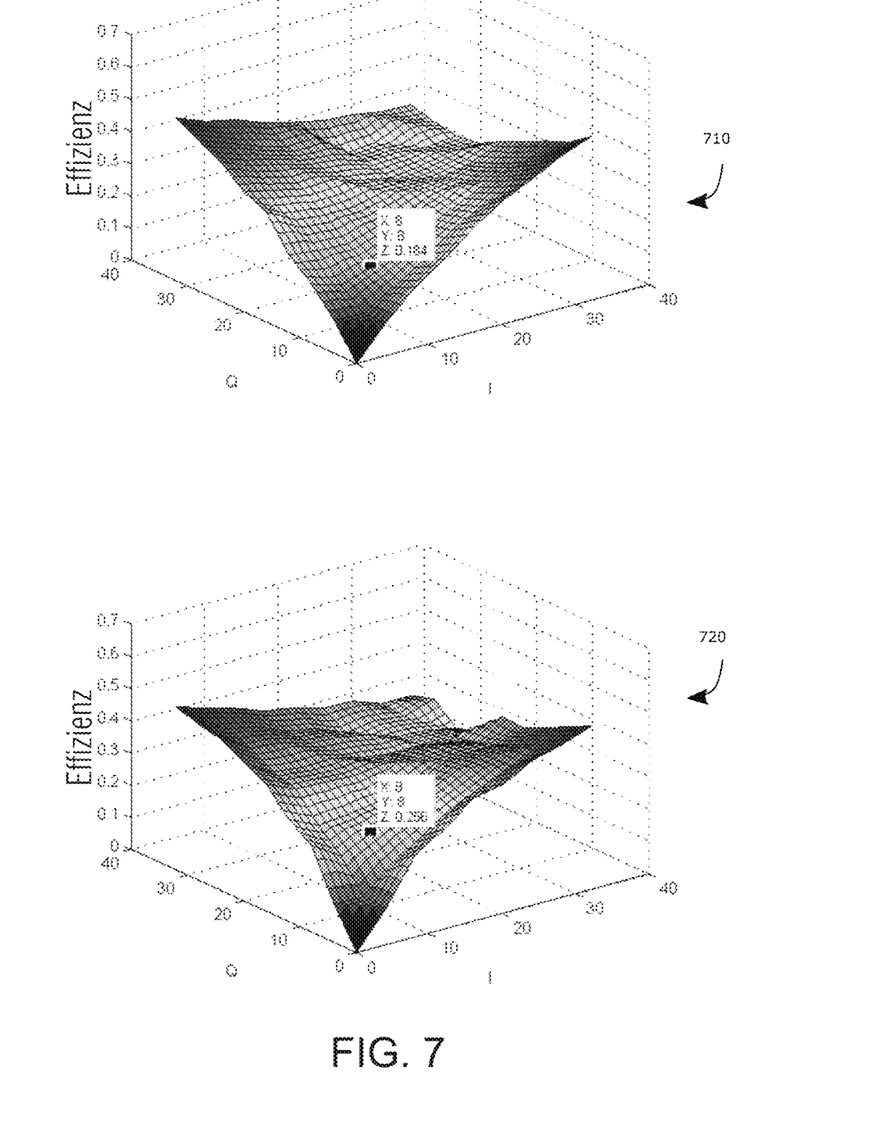
FIG. 7 illustrates a graph illustrating the efficiency of an example as compared to a conventional approach.

FIG. 7 illustrates a graph illustrating the efficiency of an example as compared to a conventional approach. The upper graph 710 illustrates the efficiency for conventional mapping, depending on the I/Q symbol to be converted. The lower graph illustrates the efficiency for the example of FIG. 1.

Beside improving the efficiency for I/Q symbols on both axes (points (i,0) and (0,q)) further significant improvement can be observed for symbols at an 45° angle (point with (iq,iq)).

The following table further shows the difference in efficiency measured at some specific points. It is seen that a reduction of up to 50% current consumption is measured for point (0,8). Furthermore, for point (8,8), at a 45° angle, a huge decrease of 44% is observed in current consumption. Since it is not uncommon for modern transmitters to operate at an average −12 dB back-off, i.e. around code 8 in our table, a significant current consumption reduction can be expected from applying the examples exhibiting asymmetric mapping.

| Coordinates | Symmetric Hybrid I/Q Efficiency [1] | Asymmetric Hybrid I/Q Efficiency [1] | Delta [1] |
|---|---|---|---|
| (0, 32) | 50% | 50% | 0% |
| (0, 16) | 34% | 39% | 15% |
| (0, 8) | 18% | 27% | 50% |
| (32, 0) | 51% | 50% | 0% |
| (16, 0) | 33% | 38% | 15% |
| (8, 0) | 19% | 26% | 37% |
| (16, 16) | 31% | 36% | 16% |
| (8, 8) | 18% | 26% | 44% |

Figure 8:
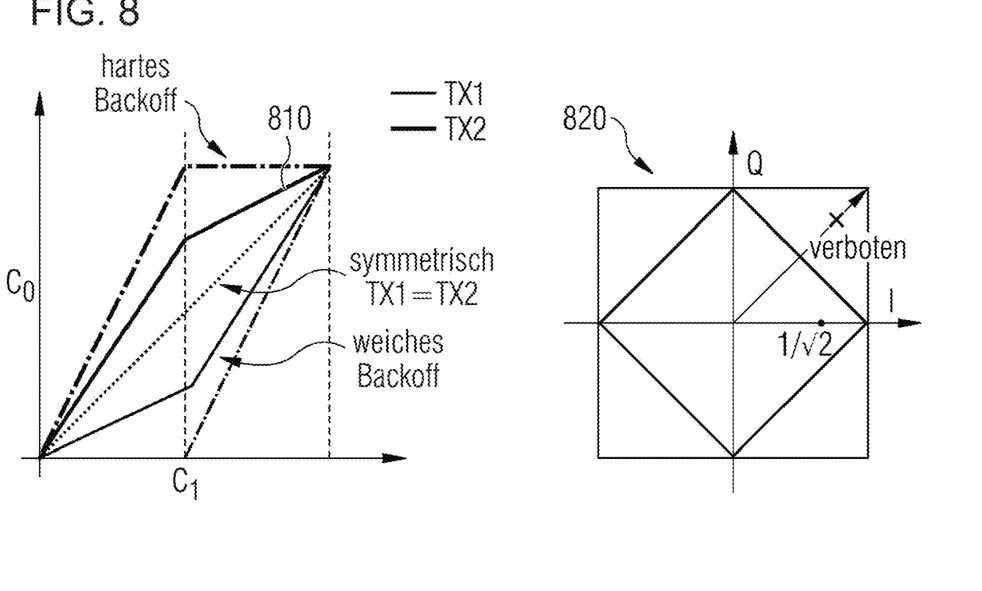
FIG. 8 illustrates a further example for selecting cells.

FIG. 8 illustrates a further example for selecting cells using a soft turn-on approach using a similar mapper-sub-mapper concept. Soft turn on may, for example, avoid abrupt turning on and off of individual cores when the input code is swept from 0 to 1. In the particular example illustrated by means of the solid curve 810 of FIG. 8, ¾ of the total power is distributed to the first couple of cores and ¼ of the total power is distributed to the second couple of cores up to when the code is lower than ½. For the then remaining codes, ¼ of the total power is distributed to the first couple of cores plus its residual value and ¾ of the total power is distributed to the second couple of cores plus its residual value. Soft turn-on techniques, and aforementioned grouped back-off technique are trading-off between symmetric and asymmetric distribution to eventually decrease signal deteriorations due to a hard transition between individual cores. All these different back-off strategies can be implemented by keeping the two opposite filling directions for i and for q signals in the sub-mappers. Opposite filling directions allow for higher efficiency, and as well overcome (without additional computational power), the violations which might occur while filling up both I and Q starting from the same direction, such as, both from the bottom. Such a fill-up strategy, if two sub-mappers share the same filling direction, would in fact lead to violations in the hybrid I/Q diamond-shape allowed transmission area. In fact, when both I and Q in the lowest core (DAC) saturate to high I and Q values, such as to (1,1), a backoff strategy where filling directions are identical for I and for Q would result in a violation of the hybrid I/Q allowed diamond-shape. In fact, the aforementioned (1,1) point cannot be transmitted by the lowest core or DAC, since hybrid I/Q does not tolerate codes at 45° exceeding (½,½), as shown in FIG. 8, right graph 820. When implementing a soft turn-on implementation, the sub mappers previously described may be modified to select a fraction of the first number of cells within a first core of the first group of cores and the remaining cells of the first number of cells within a second core of the first group of cores.

Figure 9:
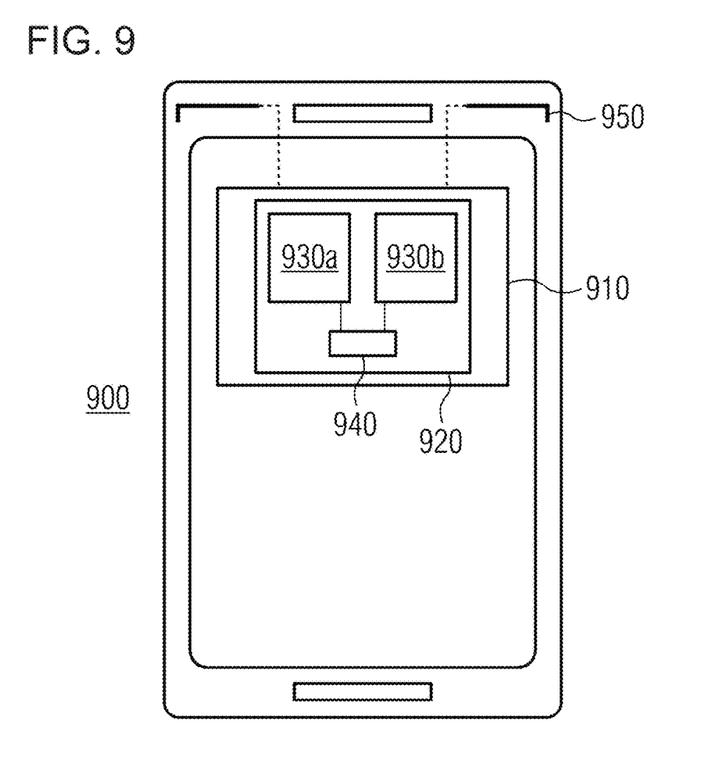
FIG. 9 illustrates an example of a mobile telecommunications device.

FIG. 9 schematically illustrates a mobile handset 900 as an example for a mobile telecommunications device using a transmitter 910 incorporating a multi core hybrid I/Q digital to analog converter 920. The multi core hybrid I/Q digital to analog converter 920 comprises at least two hybrid digital to analog converter cores 930a and 930b, each having an I-code input and a Q-code input; and a mapping circuit 940 for selecting cells of the multi core hybrid I/Q digital to analog as, for example, illustrated in FIGS. 3 to 5. Using a multi core hybrid I/Q digital to analog converter 920 within the mobile handset 900, standby and operating times of the mobile handset 900 may be increased due to the decreased energy consumption of the multi core hybrid I/Q digital to analog converter 920 when operating with an example of a mapping circuit 940.

Example 1 is a method for selecting cells of a multi core hybrid I/Q digital to analog converter, comprising defining a first group of cores and a second group of cores for each data symbol to be transmitted; selecting cells of the first group of cores for an I-code of the data symbol; and selecting cells of the second group of cores for a Q-code of the data symbol.

In example 2, the method of example 1 optionally further comprises using a first mapping algorithm to compute a first number of cells for the I-code; and using an identical second mapping algorithm to compute a second number of cells for the Q-code.

In example 3, the method of example 2 optionally further comprises selecting the first number of cells of N cores by filling the cells of the cores of the first group in an ascending order starting from the first core; and selecting the second number of cells by filling the cells of the cores of the second group in a descending order starting from the N-th core.

In example 4, the method of any of the preceding examples, optionally further comprises selecting the second number of cells of N cores by filling the cells of the cores of the second group in an ascending order starting from core+1; and selecting the first number of cells filling the cells of the cores of the first group in a descending order starting from core N/2.

In example 5, the method of example 2 optionally further comprises selecting a fraction of the first number of cells within a first core of the first group of cores and the remaining cells of the first number of cells within a second core of the first group of cores.

In example 6, in the method of any of the preceding examples, only cells of the first group of cores are selected for the I-code of the data symbol; and only cells of the second group of cores are selected for the Q-code of the data symbol.

Example 7 is a mapping circuit for selecting cells of a multi core hybrid I/Q digital to analog converter, comprising a first sub-mapping circuit configured to define a first group of cores for each data symbol to be transmitted and to select cells of the first group of cores for an I-code of the data symbol; and a second sub-mapping circuit configured to define a second group of cores for each data symbol and to select cells of the second group of cores for a Q-code of the data symbol.

In example 8, in the mapping circuit of example 7, the first sub-mapping circuit and the second sub-mapping circuit use identical logic to compute a first number of cells to select for the I-code and to compute a second number of cells to select for the Q-code.

In example 9, in the mapping circuit of example 8, N outputs of the first sub-mapping circuit for selecting the number of cells of an N-core hybrid I/O digital to analog converter are coupled to I-code inputs of the N-cores in an ascending order, and N outputs of the second sub-mapping circuit are coupled to Q-code inputs of the N-cores in a descending order.

In example 10, in the mapping circuit of example 8, N outputs of the second sub-mapping circuit for selecting the number of cells of an N-core hybrid I/O digital to analog converter are coupled to Q-code inputs of the N-cores in an ascending order starting from core+1, rolling over to the first core; and N outputs of the first sub-mapping circuit are coupled to Q-code inputs of the N-cores in a descending order starting from core N/2, rolling over to N.

Example 11 is a multi-core hybrid I/Q digital to analog converter, comprising at least two hybrid digital to analog converter cores, each having an I-code input and a Q-code input; and a mapping circuit for selecting cells of the multi core hybrid I/Q digital to analog converter according to any of examples 7 to 10.

In example 12, the multi core hybrid I/Q digital to analog converter of example 11 optionally further comprises a signal combination circuit configured to combine I-code and Q-code outputs of each of the cores to generate an analog radio frequency signal.

Example 13 is a transmitter comprising a multi core hybrid I/Q digital to analog converter according to any of examples 11 or 12.

In example 14, the transmitter of example 13 optionally further comprises a power amplifier coupled to an output of the multi core hybrid I/Q digital to analog converter.

In example 15, the transmitter of example 13 or 14, optionally further comprises a baseband signal processing path configured to calculate at least one I-code and at least one Q-code for a data symbol to be transmitted.

Example 16 is a mobile telecommunication device comprising a transmitter according to any of examples 13 to 15.

In example 17, the mobile telecommunication device of example 16, optionally further comprises at least one antenna coupled to an output of the transmitter.

Example 18 is a transceiver comprising a transmitter according to any of examples 13 to 15.

In example 19, the transceiver of example 18 optionally further comprises a receiver for receiving a radio frequency signal.

The aspects and features mentioned and described together with one or more of the previously detailed examples and figures, may as well be combined with one or more of the other examples in order to replace a like feature of the other example or in order to additionally introduce the feature to the other example.

Examples may further be or relate to a computer program having a program code for performing one or more of the above methods, when the computer program is executed on a computer or processor. Steps, operations or processes of various above-described methods may be performed by programmed computers or processors. Examples may also cover program storage devices such as digital data storage media, which are machine, processor or computer readable and encode machine-executable, processor-executable or computer-executable programs of instructions. The instructions perform or cause performing some or all of the acts of the above-described methods. The program storage devices may comprise or be, for instance, digital memories, magnetic storage media such as magnetic disks and magnetic tapes, hard drives, or optically readable digital data storage media. Further examples may also cover computers, processors or control units programmed to perform the acts of the above-described methods or (field) programmable logic arrays ((F)PLAs) or (field) programmable gate arrays ((F)PGAs), programmed to perform the acts of the above-described methods.

The description and drawings merely illustrate the principles of the disclosure. Furthermore, all examples recited herein are principally intended expressly to be only for pedagogical purposes to aid the reader in understanding the principles of the disclosure and the concepts contributed by the inventor(s) to furthering the art. All statements herein reciting principles, aspects, and examples of the disclosure, as well as specific examples thereof, are intended to encompass equivalents thereof.

A functional block denoted as "means for . . ." performing a certain function may refer to a circuit that is configured to perform a certain function. Hence, a "means for s.th." may be implemented as a "means configured to or suited for s.th.", such as a device or a circuit configured to or suited for the respective task.

Functions of various elements shown in the figures, including any functional blocks labeled as "means", "means for providing a sensor signal", "means for generating a transmit signal.", etc., may be implemented in the form of dedicated hardware, such as "a signal provider", "a signal processing unit", "a processor", "a controller", etc. as well as hardware capable of executing software in association with appropriate software. When provided by a processor, the functions may be provided by a single dedicated processor, by a single shared processor, or by a plurality of individual processors, some of which or all of which may be shared. However, the term "processor" or "controller" is by far not limited to hardware exclusively capable of executing software, but may include digital signal processor (DSP) hardware, network processor, application specific integrated circuit (ASIC), field programmable gate array (FPGA), read only memory (ROM) for storing software, random access memory (RAM), and non-volatile storage. Other hardware, conventional and/or custom, may also be included.

A block diagram may, for instance, illustrate a high-level circuit diagram implementing the principles of the disclosure. Similarly, a flow chart, a flow diagram, a state transition diagram, a pseudo code, and the like may represent various processes, operations or steps, which may, for instance, be substantially represented in computer readable medium and so executed by a computer or processor, whether or not such computer or processor is explicitly shown. Methods disclosed in the specification or in the claims may be implemented by a device having means for performing each of the respective acts of these methods.

It is to be understood that the disclosure of multiple acts, processes, operations, steps or functions disclosed in the specification or claims may not be construed as to be within the specific order, unless explicitly or implicitly stated otherwise, for instance for technical reasons. Therefore, the disclosure of multiple acts or functions will not limit these to a particular order unless such acts or functions are not interchangeable for technical reasons. Furthermore, in some examples a single act, function, process, operation or step may include or may be broken into multiple sub-acts, -functions, -processes, -operations or -steps, respectively. Such sub acts may be included and part of the disclosure of this single act unless explicitly excluded.

Furthermore, the following claims are hereby incorporated into the detailed description, where each claim may stand on its own as a separate example. While each claim may stand on its own as a separate example, it is to be noted that—although a dependent claim may refer in the claims to a specific combination with one or more other claims—other examples may also include a combination of the dependent claim with the subject matter of each other dependent or independent claim. Such combinations are explicitly proposed herein unless it is stated that a specific combination is not intended. Furthermore, it is intended to include also features of a claim to any other independent claim even if this claim is not directly made dependent to the independent claim.

What is claimed is:

1. A method for selecting cells of a multi core hybrid I/Q digital to analog converter, comprising:
   defining a first group of cores and a second group of cores for each data symbol to be transmitted;
   selecting a first number of cells of the first group of cores for an I-code of the data symbol; and
   selecting a second number of cells of the second group of cores for a Q-code of the data symbol,
   wherein the cells for the I-code of the data symbol are selected only from the first group of cores and the cells for the Q-code of the data symbol are selected only from the second group of cores.

2. The method of claim 1, further comprising:
   using a first mapping algorithm to compute the first number of cells for the I-code;
   using an identical second mapping algorithm to compute the second number of cells for the Q-code.

3. The method of claim 2, further comprising:
   selecting a fraction of the first number of cells within a first core of the first group of cores and the remaining cells of the first number of cells within a second core of the first group of cores.

4. The method of claim 1, further comprising:
   selecting the first number of cells of N cores by filling the cells of the cores of the first group in an ascending order starting from a first core; and
   selecting the second number of cells by filling the cells of the cores of the second group in a descending order starting from an N-th core.

5. The method of claim 1, further comprising:
   selecting the second number of cells of N cores by filling the cells of the cores of the second group in an ascending order starting from core (N/2)+1; and
   selecting the first number of cells filling the cells of the cores of the first group in a descending order starting from core N/2.

6. A mapping circuit for selecting cells of a multi core hybrid I/Q digital to analog converter, comprising:
   a first sub-mapping circuit configured to define a first group of cores for each data symbol to be transmitted and to select a first number of cells of the first group of cores for an I-code of the data symbol; and
   a second sub-mapping circuit configured to define a second group of cores for each data symbol and to select a second number of cells of the second group of cores for a Q-code of the data symbol,
   wherein the cells for the I-code of the data symbol are selected only from the first group of cores and the cells for the Q-code of the data symbol are selected only from the second group of cores.

7. The mapping circuit of claim 6, wherein the first sub-mapping circuit and the second sub-mapping circuit use identical logic to compute the first number of cells to select for the I-code and to compute the second number of cells to select for the Q-code.

8. The mapping circuit of claim 7, wherein
   N outputs of the first sub-mapping circuit for selecting the first number of cells of an N-core hybrid I/O digital to analog converter are coupled to I-code inputs of N-cores in an ascending order, and wherein
   N outputs of the second sub-mapping circuit are coupled to Q-code inputs of the N-cores in a descending order.

9. The mapping circuit of claim 7, wherein
   N outputs of the second sub-mapping circuit for selecting the number of cells of an N-core hybrid I/O digital to analog converter are coupled to Q-code inputs of N-cores in an ascending order starting from core (N/2)+1, rolling over to the first core; and
   N outputs of the first sub-mapping circuit are coupled to Q-code inputs of the N-cores in a descending order starting from core N/2, rolling over to N.

10. A multi core hybrid I/Q digital to analog converter, comprising
    at least two hybrid digital to analog converter cores, each having an I-code input and a Q-code input; and
    a mapping circuit for selecting cells of the multi core hybrid I/Q digital to analog converter according to claim 6.

11. The multi core hybrid I/Q digital to analog converter of claim 10, further comprising:
    a signal combination circuit configured to combine I-code and Q-code outputs of each of the cores to generate an analog radio frequency signal.

12. A transmitter comprising a multi core hybrid I/Q digital to analog converter according to claim 10.

13. The transmitter of claim 12, further comprising a power amplifier coupled to an output of the multi core hybrid I/Q digital to analog converter.

14. The transmitter of claim 12, further comprising a baseband signal processing path configured to calculate at least one I-code and at least one Q-code for a data symbol to be transmitted.

* * * * *